US012730134B2

(12) United States Patent
Doron et al.

(10) Patent No.: US 12,730,134 B2
(45) Date of Patent: Sep. 8, 2026

(54) COUPLER FOR COUPLING HIGH-FREQUENCY EM ENERGY WITH CABLES

(71) Applicant: Connected intelligence systems Ltd., Netanya (IL)

(72) Inventors: Eyal Doron, Netanya (IL); Dan Levy, Netanya (IL)

(73) Assignee: Connected intelligence systems Ltd., Netanya (IL)

(*) Notice: Subject to any disclaimer, the term of this patent is extended or adjusted under 35 U.S.C. 154(b) by 0 days.

(21) Appl. No.: 19/533,581

(22) Filed: Feb. 9, 2026

(65) Prior Publication Data

US 2026/0169036 A1 Jun. 18, 2026

Related U.S. Application Data

(63) Continuation of application No. PCT/IL2024/051172, filed on Dec. 12, 2024.

(51) Int. Cl.

*G01R 15/18* (2006.01)
*G01R 27/16* (2006.01)
*G01R 31/11* (2006.01)
*G01R 31/58* (2020.01)

(52) U.S. Cl.

CPC .......... *G01R 15/186* (2013.01); *G01R 27/16* (2013.01); *G01R 31/11* (2013.01); *G01R 31/58* (2020.01)

(58) Field of Classification Search

CPC ....... G01R 27/16; G01R 31/58; G01R 15/186
See application file for complete search history.

(56) References Cited

U.S. PATENT DOCUMENTS

| | | | |
|---|---|---|---|
| 4,694,387 | A | 9/1987 | Walker |
| 5,291,172 | A | 3/1994 | Ito et al. |
| 5,990,687 | A | 11/1999 | Williams |
| 6,437,678 | B1 | 8/2002 | Konz |
| 7,532,012 | B2 | 5/2009 | Cern |
| 9,066,415 | B2 | 6/2015 | Konz |
| 9,961,418 | B2 | 5/2018 | Rodriguez, Jr. et al. |
| 11,362,743 | B1 | 6/2022 | Williams et al. |

(Continued)

FOREIGN PATENT DOCUMENTS

| | | | |
|---|---|---|---|
| KR | 100632078 | B1 | 10/2006 |
| WO | 2023278937 | A1 | 1/2023 |

OTHER PUBLICATIONS

"Split Core Ferrites" , Wurth Elektronik—https://mexico.newark.com/en-MX/wurth-elektronik/74271151/split-core-ferrite-837-ohm-15mm/dp/33AC1296.

(Continued)

*Primary Examiner* — Minh Q Phan
(74) *Attorney, Agent, or Firm* — The Roy Gross Law Firm, LLC; Roy D. Gross

(57) ABSTRACT

A system for monitoring cables is disclosed. The system nay include: a coupler for coupling high-frequency EM energy with high or medium voltage cables, comprising: a ferrite clamp comprising a ferromagnetic non-conductive material capable of signal impeding and configured to encompass a grounding wire of a shielded cable; a first sensing connector, and a second sensing connector; and a transceiver connected to the first sensing connector and the second sensing connector and configured to be connected to one or more monitoring systems.

9 Claims, 7 Drawing Sheets

(56) References Cited

U.S. PATENT DOCUMENTS

| | | | | |
|---|---|---|---|---|
| 2006/0125609 | A1 | 6/2006 | Kline et al. | |
| 2017/0045571 | A1* | 2/2017 | Joseph ................. | G01R 15/186 |
| 2020/0067683 | A1 | 2/2020 | Kwak et al. | |
| 2021/0398711 | A1 | 12/2021 | Kim et al. | |
| 2023/0324440 | A1 | 10/2023 | Gundel et al. | |

OTHER PUBLICATIONS

"Medium Voltage Inductive Coupling Units—MICU 300A-S/LF", Grupo Premo, https://www.grupopremo.com/en/micu-300a-slf-medium-voltage-inductive-coupling-units-low-frequency-30-600khz/1905-micu-300a-s-lf.html.

PCT International Search Report and Written Opinion for International Application No. PCT/IL2024/051172, mailed Jan. 22, 2025, 11pp.

* cited by examiner

COUPLER FOR COUPLING HIGH-FREQUENCY EM ENERGY WITH CABLES

CROSS-REFERENCE TO RELATED APPLICATIONS

This application is a Continuation Application of International Application No. PCT/IL2024/051172, filed on 12 Dec. 2024, which claims the benefit of priority of: Israeli Application No. 309641, filed 18 Dec. 2023, titled "COUPLER FOR COUPLING HIGH-FREQUENCY EM ENERGY WITH CABLES" and Israeli Application No. 310694, filed 6 Feb. 2024, titled "COUPLER FOR COUPLING HIGH-FREQUENCY EM ENERGY WITH CABLES", all of which are hereby incorporated by reference in their entirety.

FIELD OF THE INVENTION

The present invention relates generally to methods of monitoring cables. More specifically, the present invention relates to a coupler and a system for coupling high-frequency EM energy with cables, for example, high-voltage or medium-voltage cables.

BACKGROUND OF THE INVENTION

High voltage (HV) and medium voltage (MV) networks are an important part of the electrical grid, as well as internal grids in industrial settings. These networks carry high voltages and currents and are critical to the operation of their clients. Breakdowns and faults in these networks cause considerable downtime and expense to the operators and clients, and may also cause catastrophic damage due to the energy produced by the fault itself. Consequently, it is important to monitor the health and operation of both the grids and their associated accessories, such as cables, terminations, splices, transformers, switchgear, and the like.

Monitoring the status, health, and operation of HV and MV network and cable can be done by monitoring electrical parameters, such as voltage, current, phase, distortion, and the like. In addition, one can monitor additional effects that have a direct bearing on asset health.

Some nonlimiting examples for such monitoring systems are given below.

One example may include monitoring partial discharge (PD), corona discharge and arcing. These are partial or complete voltage discharges between the high voltage core and (typically) a close by grounded point. The discharge may be to a grounded piece of equipment, such as a cabinet or transformer wall, or may be internal to a cable or a cable accessory. Electrically, these discharges manifest as high frequency bandwidth impulses (MHz to GHz bandwidth) traveling along both the cable core and the cable shield along an unplanned and undesirable path. The discharges are both themselves destructive, as well as being harbingers of much larger complete faults.

Another example may include Radio Frequency Analyzer (RFA), such as Time Domain Reflectometry (TDR), Frequency Domain Reflectometry (FDR), and the like. These techniques send a high bandwidth RF signal along a cable, and analyze the resulting reflections. Reflections are caused by impedance discontinuities along the cable, for example from splices, connected equipment and bifurcations. Any change in the reflections may signal an undesired change in the network, such as a fault, a disconnection, or an unplanned change in the properties of connected equipment (especially transformers). In addition, one can monitor the precise apparent positions of the reflections and thus measure the average temperature of cable segments, since the velocity of propagation of the signal along the cable depends on the insulator temperature in a known manner. Thus, one can monitor the loading of network segments so as to maximize the network capacity while avoiding overheating.

In addition to monitoring, one can use Power Line Communication (PLC) to send and receive information along a power cable, for example from monitoring devices that do not have access to alternate modes of communication.

In order to perform PD or RFA measurements or perform PLC, one must couple high frequencies to the power transmission line, while filtering out the much larger line frequency voltages.

PD measurements, may be conducted using several coupling methods known in the art.

Capacitive couplers which are high voltage capacitors directly connected to the high voltage core. They give a very good high frequency connection to the cable core, and are also bidirectionally symmetric and well suited to RFA measurements as well. However, they are complicated to build and mount, as they require a connection that can withstand the high voltage of the core, and may themselves comprise a potential grid failure point. Mounting is also limited to specific types of accessories, which may not be available at the desired point. Finally, they require a power shutdown during installation.

Inductive couplers, most notably High-Frequency Current Transformers (HFCTs). These are coils usually placed around the cable neutral (shield) connection, near its attachment to the local grounding element. However, these devices can be expensive, limiting deployment. In addition, they are not symmetric due to the large difference between the number of primary windings (one, consisting of the ground cable itself) and secondary windings (a large number, to obtain sufficient sensitivity).

Electrical field sensors such as Transient Earth Voltage (TEV) sensors. These sensors pick up PD-related transient electrical fields emitted by discontinuities in the earth path, such as openings in a cabinet metal case. They are however not suited to detecting PD signals propagating along a cable, and are also almost impossible to calibrate since the field emission is highly dependent on the particular setup.

RFA may be conducted using an online RFA sensor such as the Wirescan Live sensor from Wirescan™ AS, Norway, based on a combination of inductive and capacitive sensing. The device comprises an inductive signal injector, a capacitive voltage coupler, and an inductive current coupler. The entire setup is mounted on an industry standard T-type cable termination. The device injects a wideband signal using the injector, which sits on an unshielded part of the connector and so inductively couples a signal into the cable core. The resulting voltage and current are picked up by their respective couplers, and the ratio is used in RFA measurements. The coupling of the device to the MV or HV cables is based on a T-body, and so is of course limited to T-body installations, and can't be used in e.g. live-front terminations. It also necessitates a power shutdown to install, and is complex and expensive.

Another example is a capacitive coupler designed to be inserted into a T-body connector instead of its existing insulating plug. It uses a high voltage capacitor to directly inject signals into the cable core, and measure the resulting current. It also enables measuring the line voltage waveform via a capacitive voltage divider. This coupler allows both PD and RFA measurements since it directly couples to the cable core. However, it requires a T-body connection to operate and also necessitates switching off the power.

Accordingly, there is a need for a new coupler that will allow connecting in parallel multiple monitoring methods (e.g., PD, RFA, PLC, HTF, etc.) in MV and HV cables and systems while allowing the normal electrical power provision of the system.

SUMMARY OF THE INVENTION

Some aspects of the invention may be directed to system for monitoring cables comprising: a coupler for coupling high-frequency EM energy with high or medium voltage cables, comprising: a ferrite clamp comprising a ferromagnetic non-conductive material capable of signal impeding and configured to encompass a grounding wire of a shielded cable; a first sensing connector; and a second sensing connector. In some embodiment, in configuration (a) the first sensing connector is connected to the ground cable shield near a first side and the second connector is connected to the ground cable shield near a second opposite side. Alternatively in some embodiments, in configuration (b) the first sensing connector is connected directly to the grounding element (e.g., ground bar), and the second connector is connected to a conductive sheath placed on the outside of the high-voltage or medium-voltage cable's jacket; and a transceiver connected, at either configuration (a) or configuration (b), to the first sensing connector and the second sensing connector and configured to be connected to one or more monitoring systems.

In some embodiments, the grounding wire is at least one of, a wire braided from shield wires of the high or medium voltage cable, and a wire connected to the shield. Grounding wire is connectable to a grounding element of a high or a medium voltage cable system.

In some embodiments, the transceiver is connectable to at least one of a radio frequency analyzer (RFA), time domain reflectometry (TDR), frequency domain reflectometry (FDR), a partial discharge (PD) monitor, and power line communication (PLC) circuits.

In some embodiments, the coupler further comprises a hollow body, holding the ferrite clamp, and configured to be attached to the ground wire, wherein the hollow body has two cable entrances, a first entrance at the grounding element side and a second entrance at the cable side and wherein the first entrance is located at the first side and the second entrance at the second side.

In some embodiments, the coupler further comprises one or more conductive windings wound on a wall of the ferrite clamp, and connected to a lowpass filter.

In some embodiments, the coupler further comprises one or more conductive windings wound on a wall of ferrite clamp connected to an active current source; and at least one sensing wire wound on a wall of the ferrite clamp connected to a voltage sensor.

In some embodiments, the first and second sensing connectors comprise at least one of, conductive wires and clamps.

In some embodiments, the system may further include at least two monitoring systems selected from: a radio frequency analyzer (RFA), time domain reflectometry (TDR), frequency domain reflectometry (FDR), a partial discharge (PD) monitor, and power line communication (PLC) circuits.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
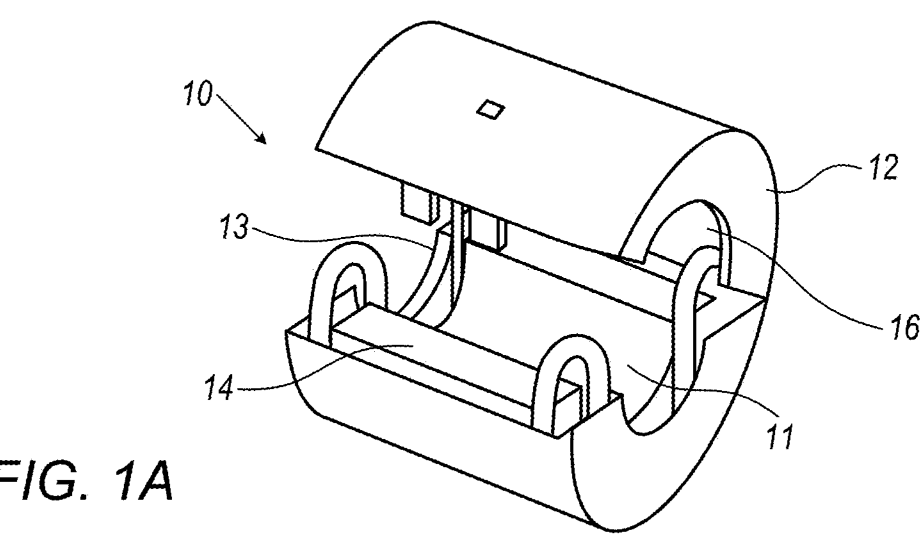
FIG. 1A is an image of a nonlimiting example of a ferrite clamp according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

A system according to embodiments of the invention may be configured to work only with transmission lines, i.e., two-wire cables (for example, coaxial cables such as underground MV/HV cables). Such a system may not work with single-wire cables, for example, overhead MV/HV cables. Therefore, the system may include a ground cable shield as further discussed herein below. In some embodiments, the system may include a coupler, and a transceiver.

A coupler according to the embodiments of the invention may allow conducting in parallel multiple monitoring method of electric systems, such as, a live HV or MV power systems, i.e., without the need for shutting down the power in the systems. Such a coupler includes a ferrite clamp comprising a ferromagnetic non-conductive material capable of signal impeding and may be configured to encompass the ground cable in the electric systems. In some embodiments, the coupler may include a pair of connectors configured to be connected in parallel to at least two of the following monitoring systems: a radio frequency analyzer (RFA), time domain reflectometry (TDR) circuit, frequency domain reflectometry (FDR) circuit, and a partial discharge (PD) monitor, power line communication (PLC) and the like.

Reference is now made to FIG. 1A which is an image of a nonlimiting example of a ferrite clamp according to some embodiments of the invention. A ferrite clamp 10, for example, model 742-712-51 clamp from Würth Elektronik™, illustrated, may include a hollow body 12 holding two halves 14 and 16 of a ferromagnetic non-conductive material. In the nonlimiting example of FIG. 1A, the ferromagnetic non-conductive material is divided into two halves 14 and 16 of a hollow tube. This structure may allow to encompass a grounding wire of a shielded cable, as shown in FIGS. 2A-2D herein below. Clamp 10 may include a first entrance at the grounding element (e.g., ground bar) side 11 and a second entrance at the high or medium cable side 13.

In some embodiments, the ferromagnetic non-conductive material (i.e., ferrite) is selected to be able to impede high frequency (e.g., above 100 kHz) EM signals. Therefore, such a ferromagnetic non-conductive material may be selected to induce at the relevant frequencies an effective non-zero impedance on the ground cable. In some embodiments, the impedance results from the magnetic flux and the associated magnetic energy induced in the ferrite material by currents flowing in the ground cable. Such ferrite materials and clamps are commonly used to impede the propagation of high-frequency signals along wires, thus filtering out high-frequency noise while passing through lower frequencies.

Figure 1B:
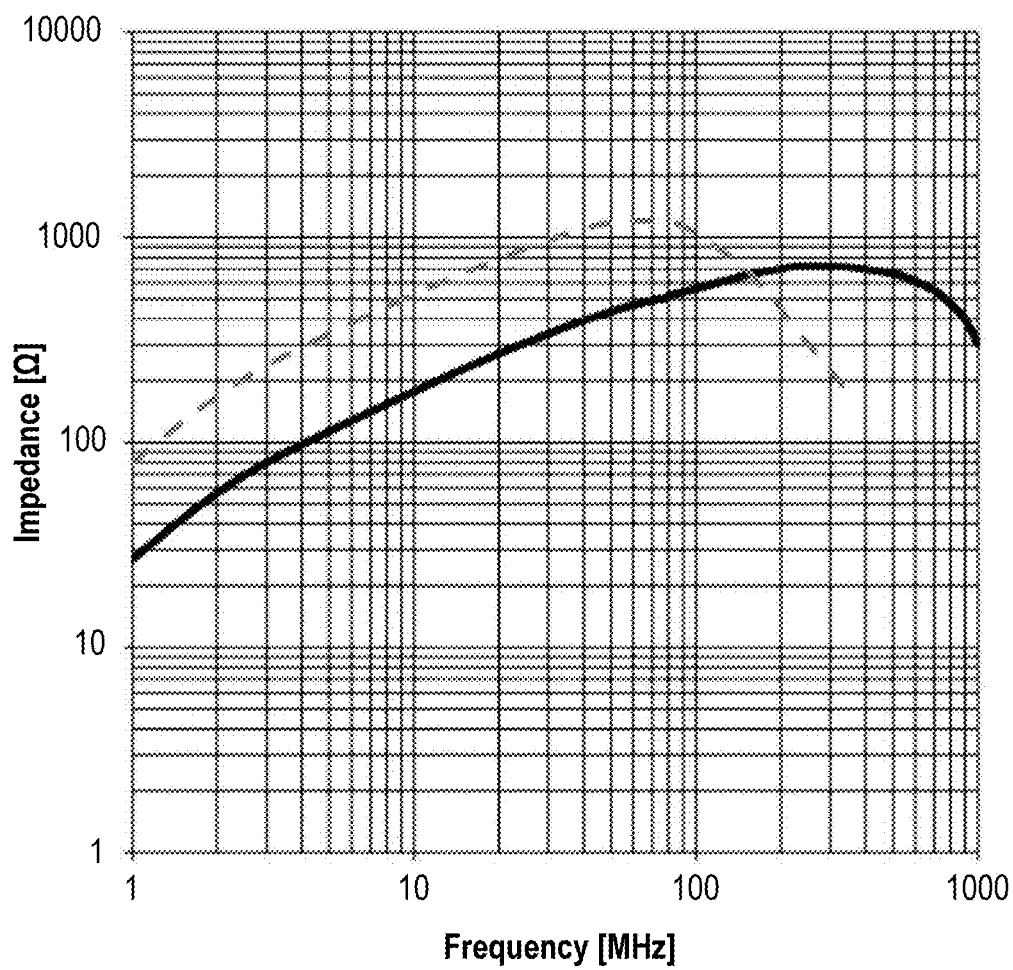
FIG. 1B is a graph of a nonlimiting example of the impedance characteristics of a ferrite clamp according to some embodiments of the invention.

A nonlimiting example of such a behavior is given in the graph of FIG. 1B, which shows a graph of the impedance characteristics of the model 742-712-51 clamp. As shown, frequencies in the MHz range see an impedance of at least a few tens of ohms, while low-frequency signals, such as AC line frequencies, will encounter essentially a short circuit. Therefore, when ferrite clamp 10 is placed around a ground cable of an MV or HV shielded cable, any RF signal propagating along the wire may encounter the ferrite-induced impedance, which may cause a voltage differential to appear between the two ends of ferrite clamp 10. This voltage difference may be picked up by connectors, galvanically connected to the ground cable on either side of the ferrite clamp 10, and be subsequently analyzed for the given measurement modality, as discussed herein below.

Figure 1C:
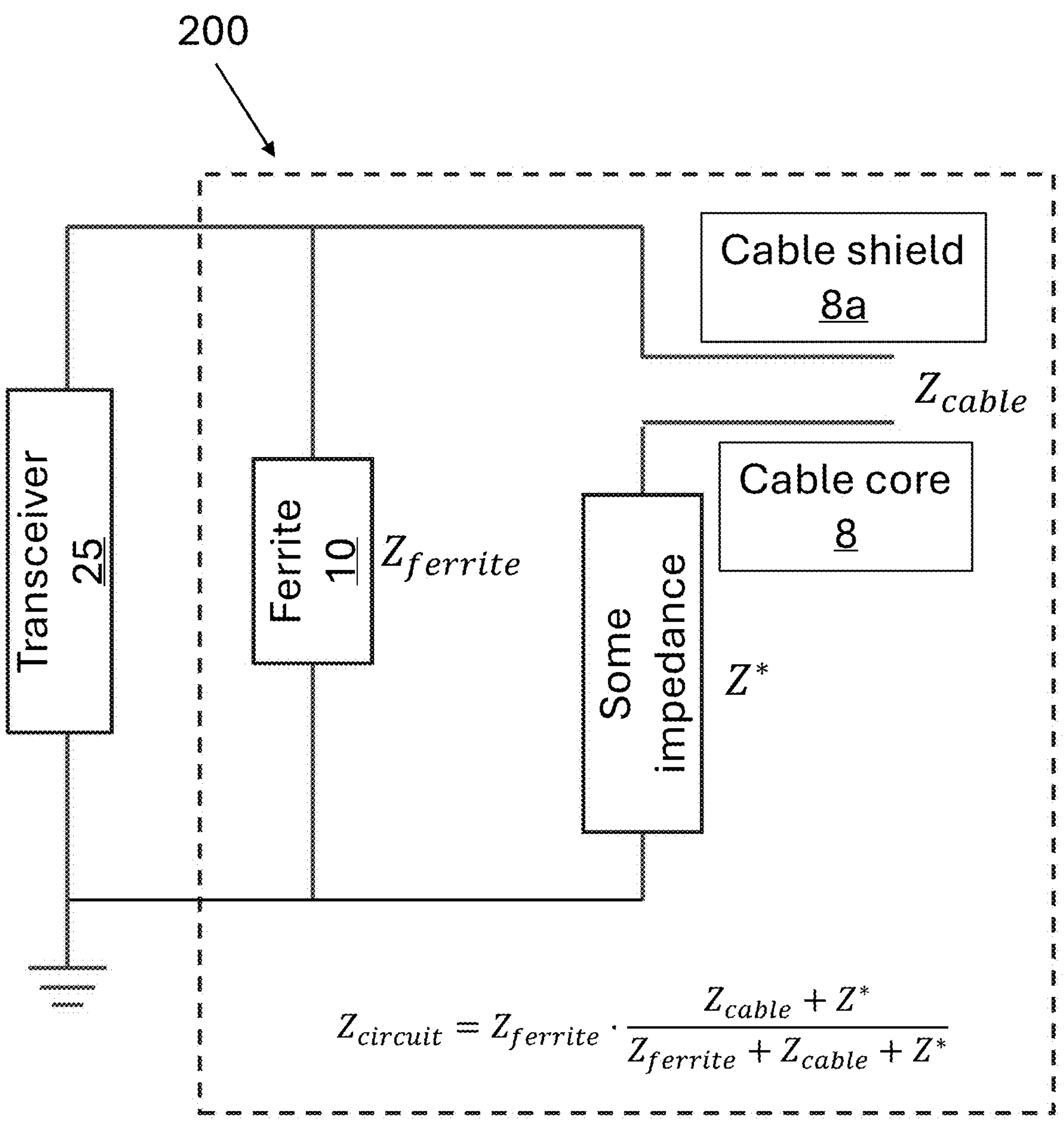
FIG. 1C is a diagrammatic representation of the electrical circuit of a system for monitoring cables according to some embodiments of the invention.

Reference is now made to FIG. 1C which is a diagrammatic representation of the electrical circuit of a system for monitoring cables according to some embodiments of the invention. A system 200 may include a transceiver 25, and a coupler 100 (illustrated in FIGS. 2A, 2B, 2C, and 2D) comprising ferrite clamp 10. In some embodiments, transceiver 25 may be connected in parallel to the ferrite in ferrite clamp 10, and a cable 8, where cable core 8 may be connected in series to some impedance to the ground (illustrated in FIGS. 2A, 2B, 2C, and 2D). This typically unknown impedance is always present and may include other cables in a multi-phase electrical system and/or parasitic capacitance for example. The impedance of the circuit in the dashed box $Z_{circuit}$ to which transceiver 25 is connected is given by Equation (1):

$$Z_{circuit} = Z_{ferrite} \cdot \frac{Z_{cable} + Z^*}{Z_{ferrite} + Z_{cable} + Z^*} \quad (1)$$

where $Z_{cable}$ is the impedance of cable 8, $Z_{ferrite}$ is the impedance of a ferrite clamp 10, and Z is the impedance in series with the cable core and the ground.

In some embodiments, transceiver 25 may be able to transmit/receive signals to/from the transmission line (e.g., cable 8). If the impedances fulfill both ($Z_{ferrite} >> Z_{cable}$) and ($Z_{cable} >> Z^*$), the impedance of the system may be dominated by $Z_{cable}$, i.e., $Z_{circuit} \approx Z_{cable}$. The first condition could be fulfilled by choosing the appropriate ferrite in the monitored RF frequencies. Regarding the second condition, the inventor surprisingly found that it is at least partially fulfilled in many real-world cases for RF frequencies. In these frequencies, parasitic capacitance in transformers, electrical cabinets and such could be at the order of or below the transmission line's impedance. Thus, owing to the ferrite coupler, transceiver 25 may be effectively coupled to the transmission line despite being connected only to the cable shield 8*a*.

Figure 2A:
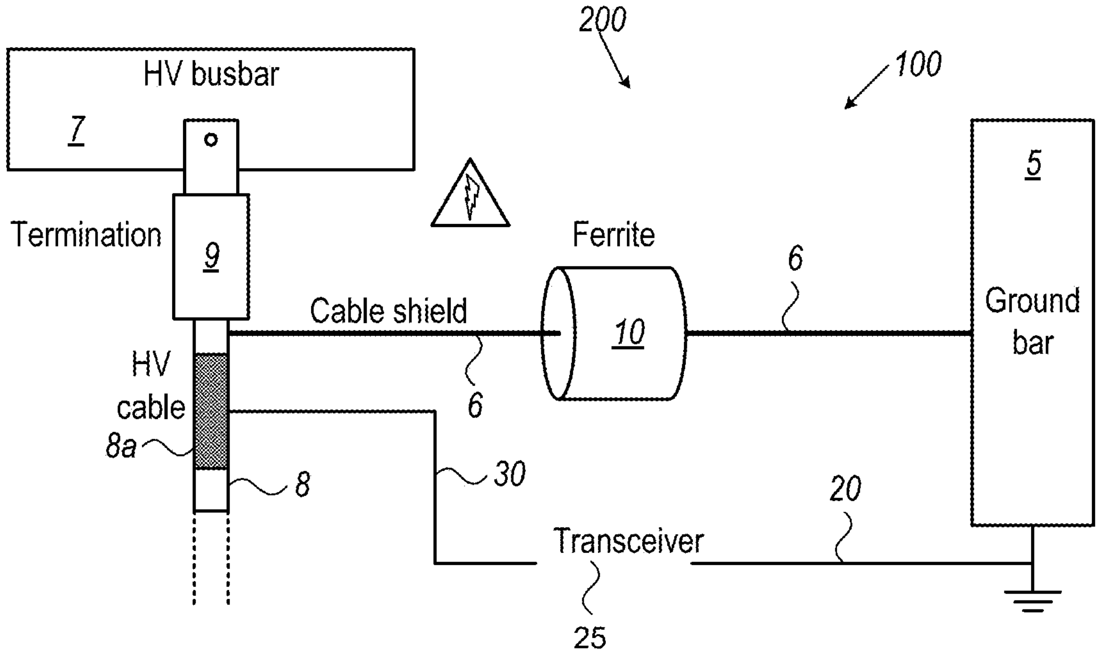
FIGS. 2A, 2B, 2C and 2D, are illustrations of systems for monitoring cables according to some embodiments of the invention.
Figure 2B:
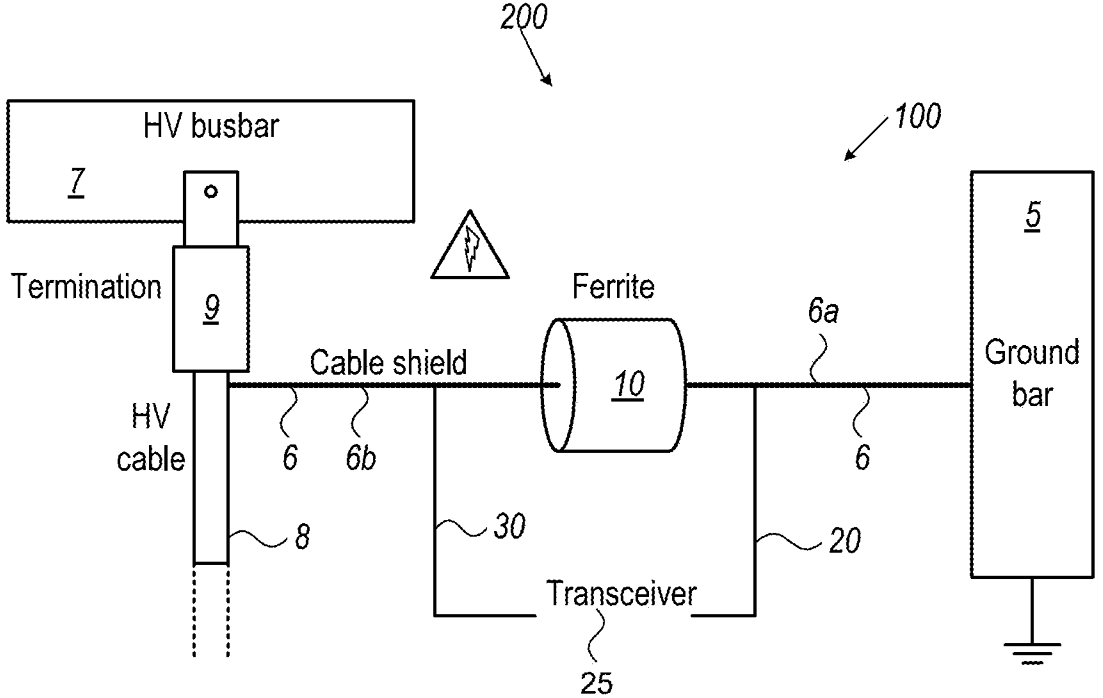
Figure 2C:
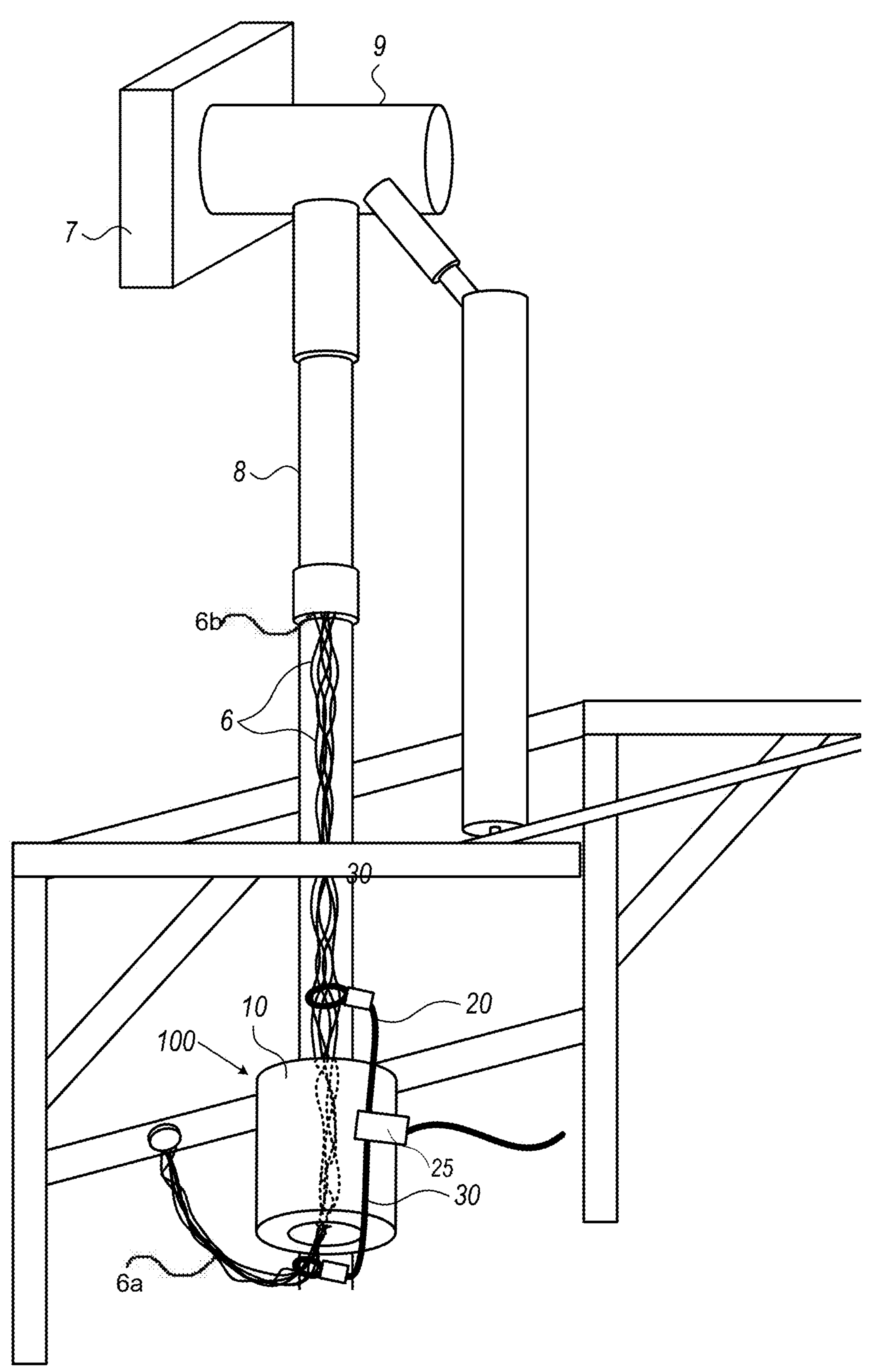
Figure 2D:
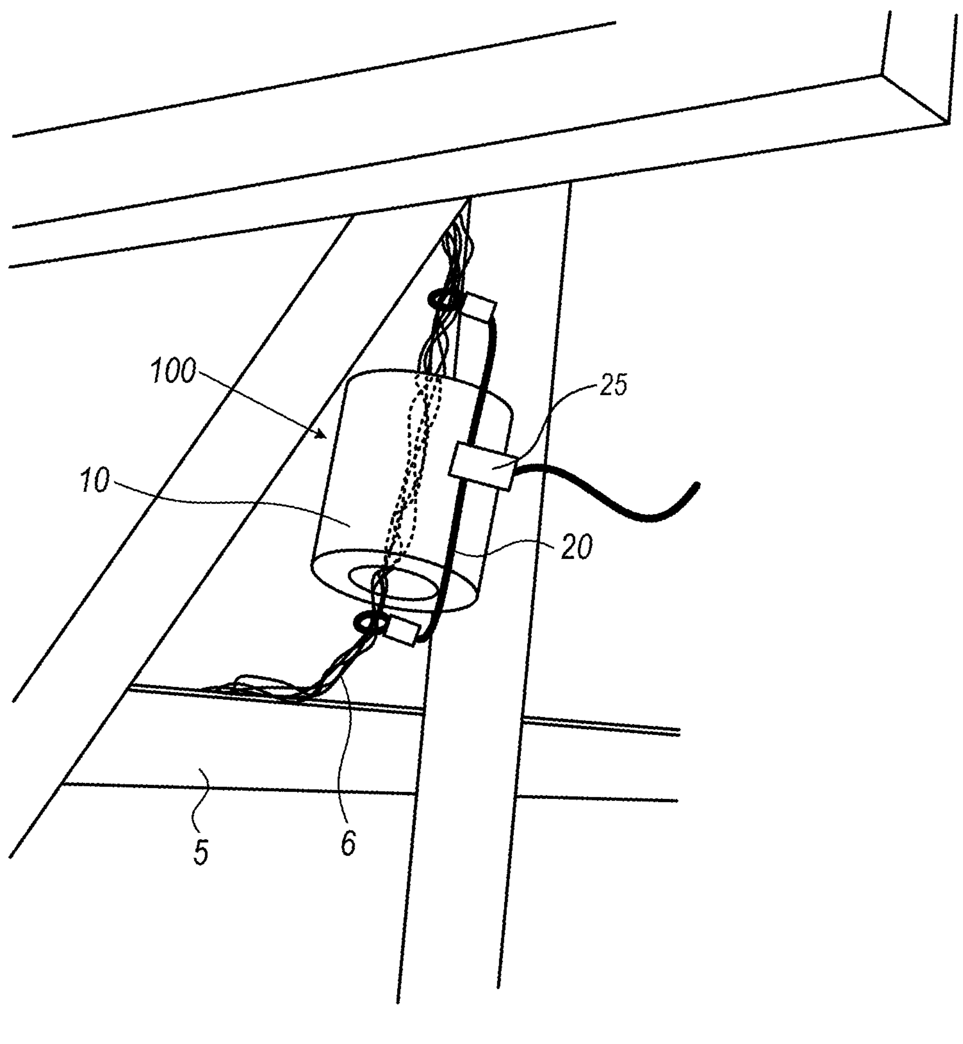

Reference is now made to FIGS. 2A, 2B, 2C, and 2D which are illustrations of systems for monitoring cables and couplers for coupling high-frequency EM energy with cables (e.g., high-frequency EM energy with high-voltage or medium-voltage cables) according to some embodiments of the invention. FIGS. 2A and 2B are diagrammatic representations of two configurations for systems 200 for monitoring cables and FIGS. 2C, 2D show nonlimiting examples of couplers 100 assembled in high-voltage or medium-voltage cables systems. System 200 may include a coupler 100 and transceiver 25.

Coupler 100 may include ferrite clamp 10 discussed herein above and a first sensing connector 20 and a second sensing connector 30. Ferrite clamp 10 may be configured to encompass a grounding wire 6. In some embodiments, grounding wire 6 is connectable to a grounding element 5 (e.g., a ground bar) of a high or a medium voltage cable 8. In some embodiments, the system may further include termination 9 connected to HV or MV busbar 7. In some embodiments, first sensing connector 20 and second sensing connector 30 may be connectable to at least one of the following monitoring systems, a radio frequency analyzer (RFA), time domain reflectometry (TDR), frequency domain reflectometry (FDR), a partial discharge (PD) monitor, power line communication (PLC), and the like.

In some embodiments, first sensing connector 20 is connected directly to ground cable 5, and second connector 30 is connected to a conductive sheath 8*a* placed on the outside of cable's 8 jacket, as illustrated in FIG. 2A. In a nonlimiting example, such a connection may provide the benefit of no wiring in the high voltage region.

In some embodiments, first sensing connector 20 is connected to grounding wire 6 near first side (e.g., ground bar side 11) of ferrite clamp 10 and second connector 30 is connected to ground grounding wire 6 near second opposite side (e.g., high or medium cable side 13) of ferrite clamp 10, as illustrated in FIG. 2D. Such an arrangement may form a direct coupler connection to grounding element 5 to grounding wire 6.

In some embodiments, first sensing connector 20 and second sensing connector 30 may include at least one of, wires, clamps. In some embodiments, connector 20 may be different from connector 30, for example, when connector 20 is configured to be connected to high or medium voltage cable 8 system and connector 30 is configured to be connected to ground cable 5, as illustrated in FIG. 2A. Alternatively, connector 20 and 30 may be the same when connected from two sides 6*a* and 6*b* of grounding wire 6, as illustrated in FIG. 2B.

In some embodiments, grounding wire 6 may include any cover/coating of a high or a medium voltage cable 8 that prevents interfering signals from the inside of the cable from reaching the outside and disturbing other cables or electrical devices. Therefore, grounding wire 6 may be made or may include conductive material, such as, aluminum, copper, a conducting polymer (e.g., a composite material) and the like.

In some embodiments, ground bar 5, may be any earthing bar, for example, a copper bar for grounding, a high or a medium voltage cable 8.

In some embodiments, HV or MV busbar 7 may include a metallic strip or bar, typically housed inside switchgear, panel boards, and busway enclosures for local high current power distribution.

In some embodiments, termination 9 may be any system that allows safe distribution of electrical power to a variety of consumers. Some nonlimiting examples for terminations may include, Soldered terminations, Crimped Terminations, Compression Terminations, Wire Wrap Terminations, Insulation Displacement Terminations (IDTs), and the like.

Figure 4:
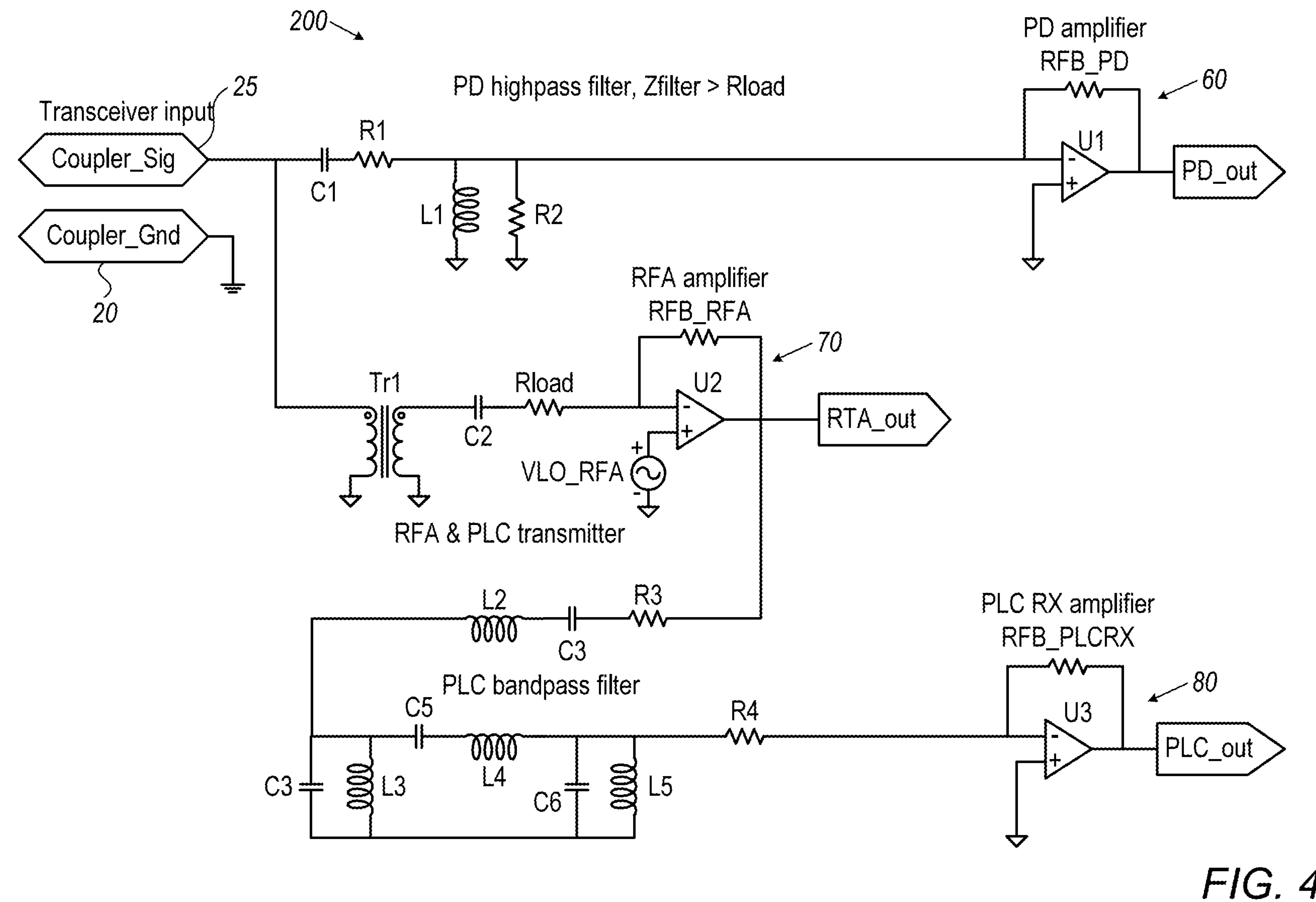
FIG. 4 is an illustration of an electric circuit of a system for monitoring cables according to some embodiments of the invention.

Transceiver 25 may be connected to first sensing connector 20 and second sensing connector 30 and may be configured to be connected to one or more monitoring systems, for example, two or more of monitoring systems 60, 70 and 80 discussed with respect to FIG. 4.

Figure 3A:
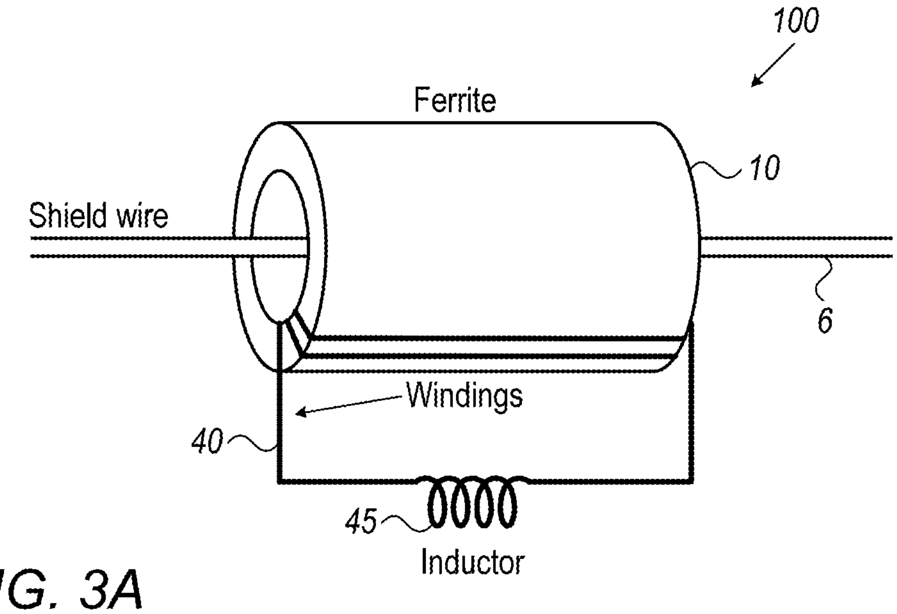
FIG. 3A is an illustration of another coupler for coupling high-frequency EM energy with cables according to some embodiments of the invention.

Reference is now made to FIG. 3A which is an illustration of another coupler for coupling high-frequency EM energy with cables (e.g., high-frequency EM energy with high-voltage or medium-voltage cables) according to some embodiments of the invention. In some embodiments, coupler 100 may further include one or more conductive windings 40 wound around a wall of ferrite clamp 10, and connected to a lowpass filter 45.

In some embodiments, filter 45 may be any filter that passes signals with a frequency lower than a selected cutoff frequency and attenuates signals with frequencies higher than the cutoff frequency. Some nonlimiting examples for lowpass filters may include an inductor (as illustrated) or a combination of inductors, capacitors and resistors configured as a filter of higher order. Some nonlimiting examples for electronic lowpass filters may include resistor-capacitor (RC) filter, resistor-inductor (RL) filter, resistor, inductor, and capacitor (RLC) filter, high order passive filter, and the like.

In some embodiments, lowpass filter 45 may allow preventing magnetic saturation of the ferrite material. In case the shield carries a significant line frequency current, the ferrite may saturate and not meet its impedance curve (FIG. 1B). In order to mitigate this, one or more conductive windings 40 can be wound on a wall of the ferrite, and connected at both ends to lowpass filter 45. At low frequencies (below the cutoff frequency, which may be higher than line frequency (~50 Hz) and lower than RFA frequency (~1 MHz)) lowpass filter 45 impedance is low, and so the current induced in the windings cancels the magnetic flux in the ferrite, thus mitigating the ferrite saturation. At high frequencies (above the cutoff frequency) the impedance of lowpass filter 45 is high, and so the canceling current is low, thus preserving the induced impedance on grounding wire 6 illustrated in FIGS. 2A-2D induced by the enclosing ferrite.

Figure 3B:
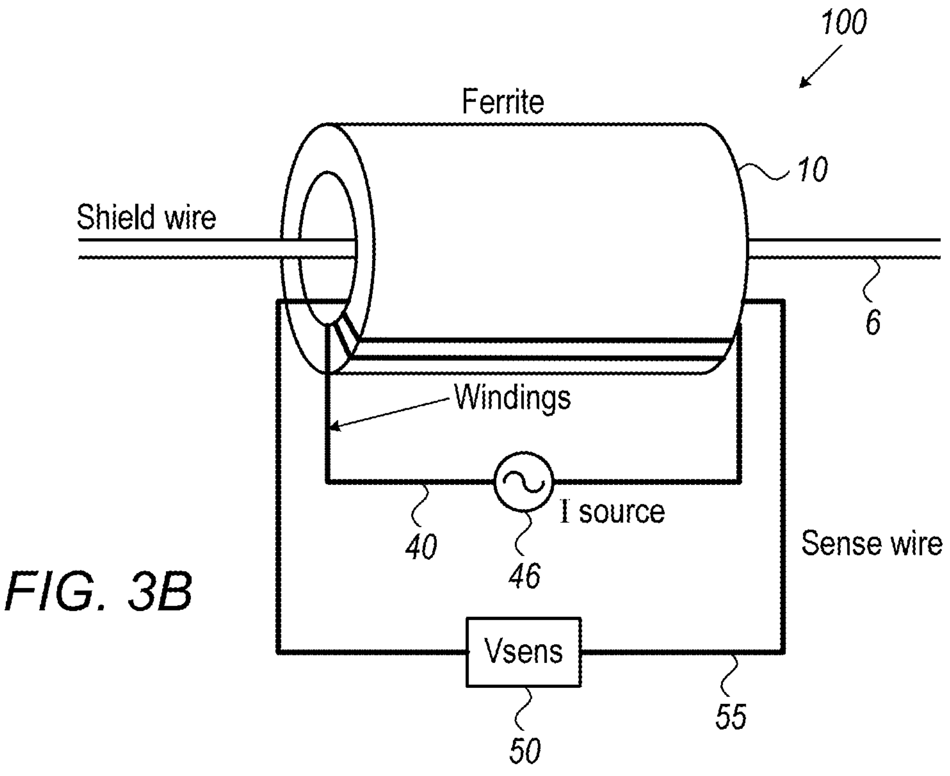
FIG. 3B is an illustration of another coupler for coupling high-frequency EM energy with cables according to some embodiments of the invention.

Reference is now made to FIG. 3B which is an illustration of another coupler for coupling high-frequency EM energy with (e.g., high-frequency EM energy with high-voltage or medium-voltage cables) according to some embodiments of the invention.

Coupler 100 of FIG. 3B is another nonlimiting example for preventing passive ferrite saturation. In some embodiments, coupler 100 may further include one or more conductive windings 40 wound on a wall of ferrite clamp 10, and connected to an active current source 46. In some embodiments, active current source 46 forces a current through conductive windings 40. Coupler 100 may further include at least one sensing wire 55 wound on a wall of ferrite clamp 10 connected to sensor 50. In some embodiments, the total magnetic flux in the ferrite is monitored using the sense wire voltage 50, and an analog or digital control feedback loop comprising sensor 50 is constructed, in order to modify the current of the current source so as to minimize the total flux, i.e. the sensing wire voltage 50, at the line frequencies.

Reference is now made to FIG. 4 which is an illustration of an electric circuit of a system for monitoring cables (e.g., high-frequency EM energy with high-voltage or medium-voltage cables) according to some embodiments of the invention. System 200 may include coupler 100 according to any one of the embodiments disclosed herein above, and at least two monitoring systems. Some nonlimiting examples for such monitoring system may include: a radio frequency analyzer (RFA) 70, time domain reflectometry (TDR), frequency domain reflectometry (FDR), a partial discharge (PD) monitor 60, power line communication (PLC) monitor 80, and the like.

In some embodiments, PD monitor 60 may include the circuit of a high-pass filter of impedance R1, followed by an amplifier. The output PD_out is measured to determine the partial discharge signal.

In some embodiments, RFA analyzer 70 may include a voltage-oscillator feedback resistor "VLO_RFA" that imposes an alternating high frequency voltage on the inverting input of U2, and through C2 and transformer Trl also on the coupler. The resulting current flows through feedback resistor RFB_RFA and is measured at terminal RFA_out. The value of RFA_out together with the excitation voltage is used to calculate the coupler impedance.

In some embodiments, PLC monitor 80 may allow forming PLC transmission using the RFA oscillator. During reception, the signal RFA_out is further filtered and amplified, and the output PLC_out is used to process the received signal.

In some embodiments, an impedance is presented by the various circuits consisting of impedance Rload in parallel with the PD filter impedance R1. For the circuits to work together, it is required that Rload<R1, and also that Rload be larger or of the same order as the expected coupler impedance. In this manner, the PD circuit does not unduly load the RFA circuit. For example, Rload may be 50 ohms, while a typical MV cable impedance is usually between 20 ohms and 50 ohms. Thus, the PD high-pass filter may be designed to have an impedance of about 200 ohms. The remaining effect of the PD filter loading on the RFA circuit may then be easily calibrated out during production.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A system for monitoring cables comprising:

a coupler for coupling high-frequency EM energy with a high or a medium voltage cable, comprising:

a ferrite clamp comprising a ferromagnetic non-conductive material capable of signal impeding and configured to encompass a grounding wire of a shielded cable;

a first sensing connector; and a second sensing connector, in two alternative configurations, a) the first sensing connector is connected to the grounding wire near a first side of the ferrite clamp and the second sensing connector is connected to the grounding wire near a second opposite side of the ferrite clamp; or b) the first sensing connector is connected directly to a grounding element, and the second sensing connector is connected to a conductive sheath placed on an outside of the high-voltage or medium-voltage cable's jacket; and a transceiver connected, at either configuration a) or configuration b) to the first sensing connector and the second sensing connector, and configured to be connected to one or more monitoring systems.

2. The system of claim 1, wherein the grounding wire is at least one of, a cable braided from shield wires of the high or medium voltage cable, and a cable connected to the shield wires.

3. The system of claim 1, wherein the grounding wire is connectable to the grounding element.

4. The system of claim 1, wherein the transceiver is connectable to at least one of a radio frequency analyzer (RFA), time domain reflectometry (TDR), frequency domain reflectometry (FDR), a partial discharge (PD) monitor, and power line communication (PLC) circuits.

5. The system of claim 1, wherein the coupler further comprises a hollow body, holding the ferrite clamp, and configured to be attached to the ground wire, wherein the hollow body has two cable entrances, a first entrance at the grounding element side and a second entrance at the cable side and wherein the first entrance is located at the first side and the second entrance at the second side.

6. The system of claim 1, wherein the coupler further comprises one or more conductive windings wound on a wall of the ferrite clamp and connected to a lowpass filter.

7. The system of claim 1, wherein the coupler further comprises:

one or more conductive windings wound on a wall of the ferrite clamp connected to an active current source; and at least one sensing wire wound on a wall of the ferrite clamp connected to a voltage sensor.

8. The system of claim 1, wherein the first and second sensing connectors comprise at least one of conductive wires and clamps.

9. The system of claim 1, further comprising:

at least two monitoring systems selected from: a radio frequency analyzer (RFA), time domain reflectometry (TDR), frequency domain reflectometry (FDR), a partial discharge (PD) monitor, and power line communication (PLC) circuits.

* * * * *